United States Patent
Ong

(10) Patent No.: US 8,093,694 B2
(45) Date of Patent: Jan. 10, 2012

(54) METHOD OF MANUFACTURING NON-LEADED INTEGRATED CIRCUIT PACKAGE SYSTEM HAVING ETCHED DIFFERENTIAL HEIGHT LEAD STRUCTURES

(75) Inventor: You Yang Ong, Kuantan (MY)

(73) Assignee: Stats Chippac Ltd., Singapore (SG)

( * ) Notice: Subject to any disclaimer, the term of this patent is extended or adjusted under 35 U.S.C. 154(b) by 382 days.

(21) Appl. No.: 11/164,088

(22) Filed: Nov. 10, 2005

(65) Prior Publication Data

US 2006/0180904 A1    Aug. 17, 2006

Related U.S. Application Data

(60) Provisional application No. 60/653,030, filed on Feb. 14, 2005.

(51) Int. Cl.
| | |
|---|---|
| H01L 23/495 | (2006.01) |
| H01L 23/48 | (2006.01) |
| H01L 23/12 | (2006.01) |
| H01L 23/053 | (2006.01) |
| H01L 23/34 | (2006.01) |
| H01L 23/04 | (2006.01) |
| H01L 21/00 | (2006.01) |
| H01L 23/50 | (2006.01) |
| H01L 23/31 | (2006.01) |
| H01L 21/56 | (2006.01) |

(52) U.S. Cl. ........ 257/675; 257/676; 257/696; 257/701; 257/712; 257/730; 257/E23.014; 257/E23.079; 257/E23.08; 257/E23.128; 257/E21.503; 257/E21.504; 438/112; 438/122; 438/461

(58) Field of Classification Search .................. 257/696, 257/673, 693, 692, 690, 678, 676, 675, 666, 257/706, 730, 703, 687, 691, 701, 712, E23.02, E23.079, E23.08, E23.128, E21.499, E21.502–E21.504; 438/127, 112, 111, 122–124, 461

See application file for complete search history.

(56) References Cited

U.S. PATENT DOCUMENTS

| | | | | |
|---|---|---|---|---|
| 5,227,662 A * | 7/1993 | Ohno et al. | ............. | 257/676 |
| 5,334,872 A * | 8/1994 | Ueda et al. | ............. | 257/675 |
| 5,363,279 A * | 11/1994 | Cha | ............. | 361/767 |
| 5,558,267 A * | 9/1996 | Humphrey et al. | ............. | 228/4.5 |
| 5,801,439 A | 9/1998 | Fujisawa et al. | | |
| 5,821,615 A * | 10/1998 | Lee | ............. | 257/686 |
| 5,835,988 A | 11/1998 | Ishii | | |
| 5,861,668 A * | 1/1999 | Cha | ............. | 257/692 |
| 5,866,939 A * | 2/1999 | Shin et al. | ............. | 257/666 |
| 5,963,433 A * | 10/1999 | Kim | ............. | 361/813 |
| 6,020,625 A * | 2/2000 | Qin et al. | ............. | 257/666 |
| 6,319,753 B1 | 11/2001 | Ichikawa et al. | | |
| 6,424,031 B1 | 7/2002 | Glenn | | |
| 6,552,416 B1 * | 4/2003 | Foster | ............. | 257/666 |
| 6,798,046 B1 | 9/2004 | Miks | | |
| 6,825,551 B1 * | 11/2004 | Do Bento Vieira | ............. | 257/678 |
| 6,977,431 B1 | 12/2005 | Oh et al. | | |
| 7,019,389 B2 | 3/2006 | Lai et al. | | |
| 7,061,079 B2 | 6/2006 | Weng et al. | | |

(Continued)

*Primary Examiner* — Phat Cao
*Assistant Examiner* — Diana C Vieira
(74) *Attorney, Agent, or Firm* — Mikio Ishimaru

(57) ABSTRACT

A non-leaded integrated circuits package system is provided including etching differential height lead structures having inner leads at a paddle height, providing mold locks at the bending points of the differential height lead structures, etching an elevated paddle at a same height as the inner leads, mounting a first integrated circuit on the elevated paddle, and electrically connecting first electrical interconnects between the first integrated circuit and the inner leads.

20 Claims, 6 Drawing Sheets

U.S. PATENT DOCUMENTS

| | | | |
|---|---|---|---|
| 7,102,210 B2* | 9/2006 | Ichikawa | 257/666 |
| 7,122,884 B2 | 10/2006 | Cabahug et al. | |
| 2002/0084519 A1* | 7/2002 | Choi et al. | 257/678 |
| 2002/0121680 A1* | 9/2002 | Ahn et al. | 257/666 |
| 2005/0046002 A1* | 3/2005 | Lee et al. | 257/678 |
| 2005/0224924 A1* | 10/2005 | Koh et al. | 257/666 |

\* cited by examiner

METHOD OF MANUFACTURING NON-LEADED INTEGRATED CIRCUIT PACKAGE SYSTEM HAVING ETCHED DIFFERENTIAL HEIGHT LEAD STRUCTURES

CROSS-REFERENCE TO RELATED APPLICATION(S)

This application claims the benefit of U.S. Provisional Patent Application Ser. No. 60/653,030 filed Feb. 14, 2005, and the subject matter thereof is hereby incorporated herein by reference thereto.

TECHNICAL FIELD

The present invention relates generally to integrated circuit package and more particularly to quad flat non-leaded packages.

BACKGROUND ART

Modern consumer electronics, such as cellular phones, digital cameras, and music players, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions. This packaging excerpt limits the discussion to existing package technology improvements from improved manufacturing processes, package structures, performance, and stacking structures.

Pad-up quad flat non-leaded (QFN) is a mature package technology but represents less than 2% of the semiconductor gross market share out of the QFN total manufacturing volume of 18.6% in 2003. The low market penetration stems from QFN architectures that have hanging leads on the outer leads portion resulting in the package sides having interconnectivity rather than at the conventional surface mount plane (the package bottom). Most surface mount technology (SMT) end-users found it impractical to mount packages vertically or be required to use external sockets to a printed circuit board (PCB).

Another cause for the low market penetration for the pad-up QFN package is that most QFN manufacturing for the SMT interface used a saw singulation method. The cost of diamond saw blades continues to increase resulting in an overall cost increase of the QFN package technology.

An alternative to the saw singulation method, punch singulation provides a cost effective option. The punch tool exerts a dynamic cutting force on the package particularly for large QFN package sizes having thicker package profiles. The punch singulation method maturity extends the various improvement options for the QFN package technology.

Wire bonding processes become critical and difficult to control due thermosonic energy transmission into the hanging leads, which result in leads that bounce during the wire bonding. Package moldability performance is heavily reliant on the lead frame coverlay taping processes quality to hold the leads in place prior to molding. It is not viable to have differential height lead structures unsupported during the wire bonding process as taping hinders the use of a protruded islands heater block design. These complications resulted in reduced development for differential height lead structures design, except a few applications in the memory module packaging industry.

While punch singulation solved some of the problems, it also created some other critical problems. The leads being raised on the external portion of the interconnecting pad increases the risk for lead deflection during punch singulation resulting in defects such as distorted leads, metal burr, wire bond stitch cracking and metal bridging. Lead deflection also results in degraded package integrity prompting mold compound and metal lead delamination. Delamination causes moisture penetration, package cracks, and moisture resistance test (MRT) failure.

Thus, a need still remains for a non-leaded integrated circuit package that leverages improved manufacturing techniques while providing packaging features to meet the new market demands. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a non-leaded integrated circuit package system including etching differential height lead structures having inner leads at a paddle height, providing mold locks at the bending points of the differential height lead structures, etching an elevated paddle at a same height as the inner leads, mounting a first integrated circuit on the elevated paddle, and electrically connecting first electrical interconnects between the first integrated circuit and the inner leads.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
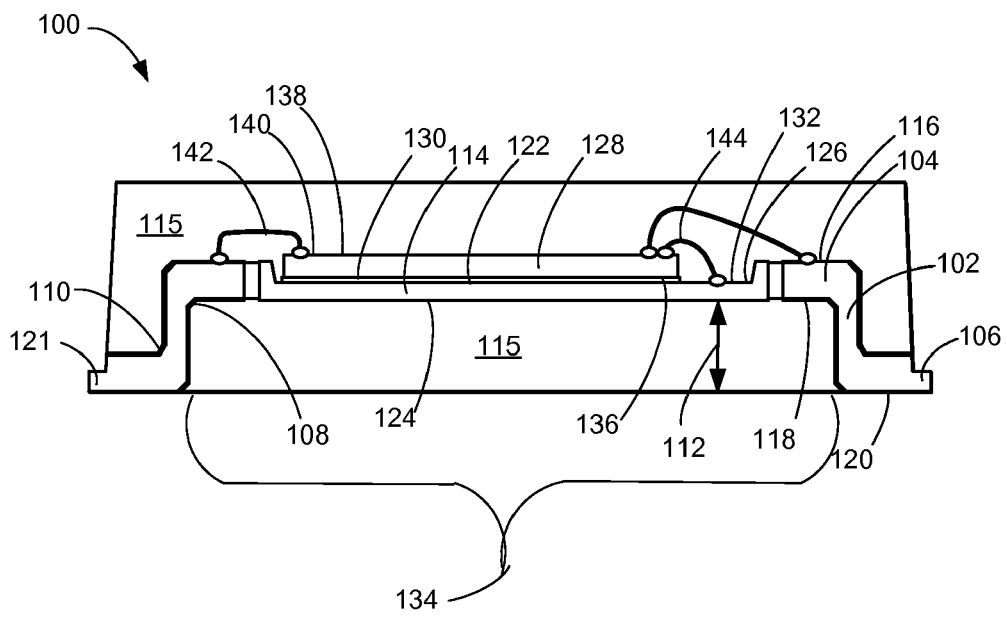
FIG. 1 is a cross-sectional view of a non-leaded integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. Generally, the device can be operated in any orientation. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a cross-sectional view of a non-leaded integrated circuit package system 100 in an embodiment of the present invention. The non-leaded integrated circuit package system 100 includes leads arranged in the bottom peripheral edges. The fabrication process of the lead frame (not shown) utilizes chemical etching to form differential height lead structures 102. The differential height lead structures 102 include inner leads 104, outer leads 106, an inner mold lock 108, and an outer mold lock 110.

The lead frame is made in one embodiment from metal such as copper alloy (Cu, Fe & P) and is thinned to a layer of approximately 15 mil using conventional milling and drawing processes. The approximately 15 mil lead frame material is half-etched to form the differential height lead structures 102. The tensile strength of the lead frame material is in the region of 400N/mm² or higher. The package unit pattern is designed and crafted from the metal sheet using chemical etching with a photoresist mask.

The inner leads 104 are the inner portions of the differential height lead structures 102 that are elevated to a predetermined height and towards the interior of the non-leaded integrated circuit package system 100. The inner leads 104 are formed to a paddle height 112 that is the same height as an elevated paddle 114. The paddle height 112 in one embodiment is half of the total height of the non-leaded integrated circuit package system 100 to allow even flow of a molding compound 115, although it is understood that the paddle height 112 is not always half of the total height. The inner leads 104 include top inner lead pads 116 and bottom inner lead pads 118 on the top surface and the bottom surface, respectively, of the inner leads 104.

The outer leads 106 are the outer portions of the differential height lead structures 102 and at the bottom of the non-leaded integrated circuit package system 100, wherein the outer leads 106 include bottom outer lead surfaces 120 to be used for external connections such as to a printed circuit board (not shown). The outer leads 106 are further half-etched on a package punch separation line to ease the singulation process. The half-etched portion of the outer leads 106 can include a reduced height extension 121 extending horizontally from the outer leads 106 along the bottom outer lead surface 120. The reduced height extension 121 can have a height that is less than the height of the outer leads 106. The half-etching is done on the lead frame top in line with the punch tool exertion direction compared to the sawing method, which usually commences from the bottom of the lead frame. This half-etch portion is called a singulation line, which joins all the units in the form of a matrix lead frame. The reduced height extension 121 of the outer leads 106 protrudes from a non-horizontal side of the molding compound 115 and extends along the bottom outer lead surface 120. No treatment is done on lead frame surface except all leads for silver (Au) wire bond will have gold (Ag) plating on the wire bond surface.

Chemical etching forms two bending points in the differential height lead structures 102 providing transition points to the inner leads 104 and the outer leads 106, wherein the bending points provide mold lock features. The inner mold lock 108 is the bending point of the differential height lead structures 102 toward the inner leads 104. The outer mold lock 110 is the bending point of the differential height lead structures 102 toward the outer leads 106. The inner mold lock 108 and the outer mold lock 110 block moisture penetration once the non-leaded integrated circuit package system 100 is molded and provide enhancement to the moisture sensitivity level (MSL) performance.

Chemical etching also forms the elevated paddle 114 to the paddle height 112. The elevated paddle 114 includes a top paddle surface 122 and a bottom paddle surface 124. The elevated paddle 114 is half-etched from the top paddle surface 122 to form a paddle recess 126 or well. The elevated paddle 114 serves as the die paddle where a first integrated circuit 128, such as a mother die, attaches to the paddle recess 126 with a first conductive epoxy layer 130. The paddle recess 126 also controls the spread of the first conductive epoxy layer 130. The top paddle surface 122 that is not covered by the first conductive epoxy layer 130 includes paddle recess pads 132 for electrical connection to the paddle recess 126. The elevated paddle 114 also serves as the center cavity heat sink. The volume below the elevated paddle 114 and surrounded by the differential height lead structures 102 forms a bottom recess 134.

The first integrated circuit 128 includes a first backside 136 and a first active side 138 having circuits and first bonding pads 140 thereon. First electrical interconnects 142 and second electrical interconnects 144 connect the first bonding pads 140 to the top inner lead pads 116 and the first bonding pads 140 to the paddle recess pads 132, respectively. For illustrative purposes, the first electrical interconnects 142 and the second electrical interconnects 144 are shown as bond wires, although it is understood that the first electrical interconnects 142 and the second electrical interconnects 144 may be other electrical structures, such as solder bumps, solder balls, stud bumps, planar interconnects, or conductive posts. The inner leads 104 and the elevated paddle 114 are both at the paddle height 112 resulting in shorter wire interconnects of the first electrical interconnects 142 and the second electrical interconnects 144.

There are a number of possible wire bond methods to connect the first integrated circuit 128, such as reserve stitch stand-off bump (RSSB). The reserve stitch stand-off bump (RSSB) provides a total loop height less than 75 μm resulting in a lower profile for the non-leaded integrated circuit package system 100. Silver (Au) balls will be located at the top inner lead pads 116 while the silver (Au) stitch will be placed on top of the first bonding pads 140.

The molding compound 115 encapsulates the first integrated circuit 128, the elevated paddle 114, the differential height lead structures 102, the first electrical interconnects 142, and the second electrical interconnects 144 with the bottom outer lead surfaces 120 exposed. After encapsulation, a chemical mechanical planarization (CMP) process may be applied to expose the bottom outer lead surfaces 120.

Figure 2:
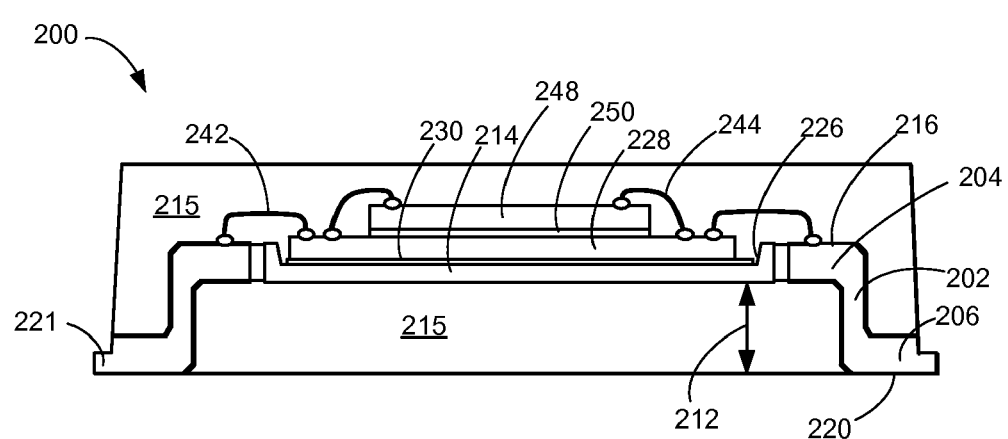
FIG. 2 is a cross-sectional view of a non-leaded integrated circuit package system in an alternative embodiment of the present invention.

Referring now to FIG. 2, therein is shown a cross-sectional view of a non-leaded integrated circuit package system 200 in an alternative embodiment of the present invention. Similar to the non-leaded integrated circuit package system 100 of FIG. 1, the non-leaded integrated circuit package system 200 includes differential height lead structures 202 with inner leads 204 formed to a paddle height 212 that is the same height as an elevated paddle 214, outer leads 206, an inner mold lock 208, and an outer mold lock 210. The inner leads 204 are the inner portions of the differential height lead structures 202 that are elevated to a predetermined height and towards the interior of the non-leaded integrated circuit package system 200. The outer leads 206 are the outer portions of the differential height lead structures 202 and at the bottom of the non-leaded integrated circuit package system 200, wherein the outer leads 206 include bottom outer lead surfaces 220. The outer leads 206 are half-etched on a package punch separation line to ease the singulation process. The half-etched portion of the outer leads 206 can include a reduced height extension 221 extending horizontally from the outer leads 206 along the bottom outer lead surface 220. The reduced height extension 221 can have a height that is less than the height of the outer leads 206. The etching forms two bending points in the differential height lead structures 202 providing transition points to the inner leads 204 and the outer leads 206, wherein the bending points provide mold lock features. The inner mold lock 208 is the bending point of the differential height lead structures 202 toward the inner leads 204. The outer mold lock 210 is the bending point of the differential height lead structures 202 toward the outer leads 206. The half-etching is done on the lead frame top in line with the punch tool exertion direction compared to the sawing method, which usually commences from the bottom of the lead frame. This half-etch portion is called a singulation line, which joins all the units in the form of a matrix lead frame. The reduced height extension 221 of the outer leads 206 protrudes from a non-horizontal side of a molding compound 215 and extends along the bottom outer lead surface 220. A first integrated circuit 228 attaches to a paddle recess 226 of the elevated paddle 214 with a first conductive epoxy layer 230. The first integrated circuit 228 connects to top inner lead pads 216 with first electrical interconnects 242.

A second integrated circuit 248 mounts above the first integrated circuit 228 with a first nonconductive adhesive film 250. The integrated circuits stack provides offsets for bonding space for the first integrated circuit 228 and the second integrated circuit 248. Second electrical interconnects 244 connect the second integrated circuit 248 to the first integrated circuit 228.

For illustrative purposes, the second integrated circuit 248 is shown smaller than the first integrated circuit 228, although it is understood that it may not be as long as sufficient bonding space remains for the electrical connections. Also for illustrative purposes, the first electrical interconnects 242 and the second electrical interconnects 244 are shown as bond wires, although it is understood that the first electrical interconnects 242 and the second electrical interconnects 244 may be other electrical structures, such as solder bumps, solder balls, stud bumps, planar interconnects, or conductive posts. It is understood the second integrated circuit 248 is thin, such as less than 4 mil, for a low profile package height. RSSB bond is preferred to control wire bond loop height and avoid wire exposure issues with achievable loop height that are less than 75 μm.

A molding compound 215 encapsulates the first integrated circuit 228, the second integrated circuit 248, the elevated paddle 214, the differential height lead structures 202, the first electrical interconnects 242, and the second electrical interconnects 244 with bottom outer lead surfaces 220 exposed.

Figure 3:
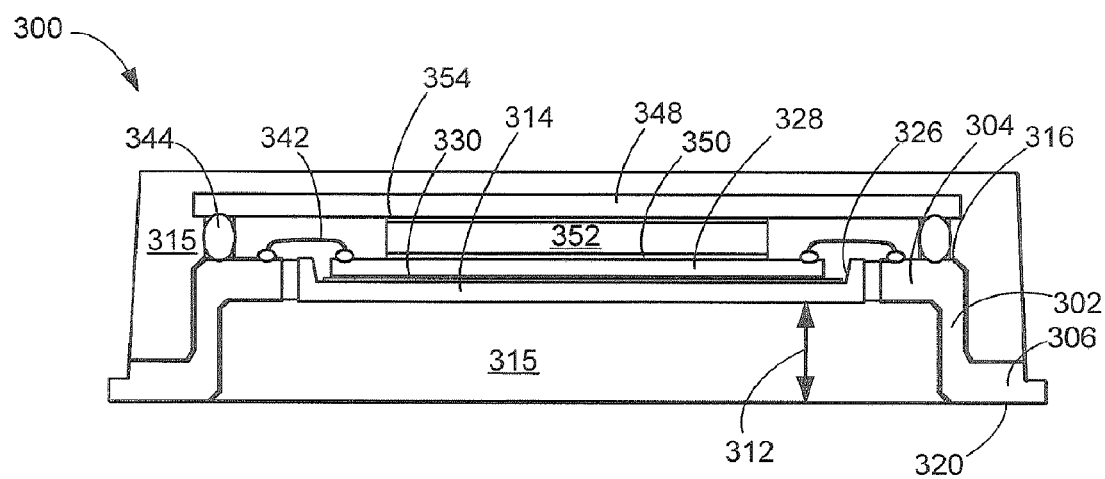
FIG. 3 is a cross-sectional view of a non-leaded integrated circuit package system in another alternative embodiment of the present invention.

Referring now to FIG. 3, therein is shown a cross-sectional view of a non-leaded integrated circuit package system 300 in another alternative embodiment of the present invention. Similar to the non-leaded integrated circuit package system 100 of FIG. 1, the non-leaded integrated circuit package system 300 includes differential height lead structures 302 with inner leads 304 formed to a paddle height 312 that is the same height as a elevated paddle 314. A first integrated circuit 328 attaches to a paddle recess 326 on the elevated paddle 314 with a first conductive epoxy layer 330. The first integrated circuit 328 connects to top inner lead pads 316 with first electrical interconnects 342.

A second integrated circuit 348, shown as a flip-chip, mounts above the first integrated circuit 328. A first nonconductive adhesive film 350 attaches on the first integrated circuit 328. A first silicon spacer 352 attaches on the first nonconductive adhesive film 350. A second nonconductive adhesive film 354 attaches on the first silicon spacer 352. The second integrated circuit 348 mounts on the second nonconductive adhesive film 354.

The combined height of the first nonconductive adhesive film 350, the second nonconductive adhesive film 354, and the first silicon spacer 352 provide height clearance for the first integrated circuit 328 and the first electrical interconnects 342. Second electrical interconnects 344 connect the second integrated circuit 348 to the top inner lead pads 316. The horizontal dimensions of the second integrated circuit 348 provides clearance for the second electrical interconnects 344 to connect beyond the first electrical interconnects 342.

For illustrative purposes, the second integrated circuit 348 is shown as larger than the first integrated circuit 328, although it is understood that it may not be as long as sufficient bonding space remains for the electrical connections between the first integrated circuit 328 and the top inner lead pads 316. The second electrical interconnects 344 are shown as solder bumps of any number of constructions, such as solder bumps grown on the second integrated circuit 348 AlSi bond pad with Cu stud prior to flip chip interconnect. The solder bumps are placed by using a stencil printing method and are later reflowed to form interconnect balls. A layer of PSG/SiN polyimide is coated on the surface of the second integrated circuit 348 for moisture protection. Not all bond pads of the second integrated circuit 348 have to be bumped with solder balls for a second tier interconnect to be used for die-to-die bonding where there are similar or shared I/O.

A molding compound 315 encapsulates the first integrated circuit 328, the second integrated circuit 348, the elevated paddle 314, the differential height lead structures 302, the first electrical interconnects 342, and the second electrical interconnects 344 with bottom outer lead surfaces 320 exposed. Mold clearance for the second integrated circuit 348 to package top surface can remain a minimum of 4 mils.

Figure 4:
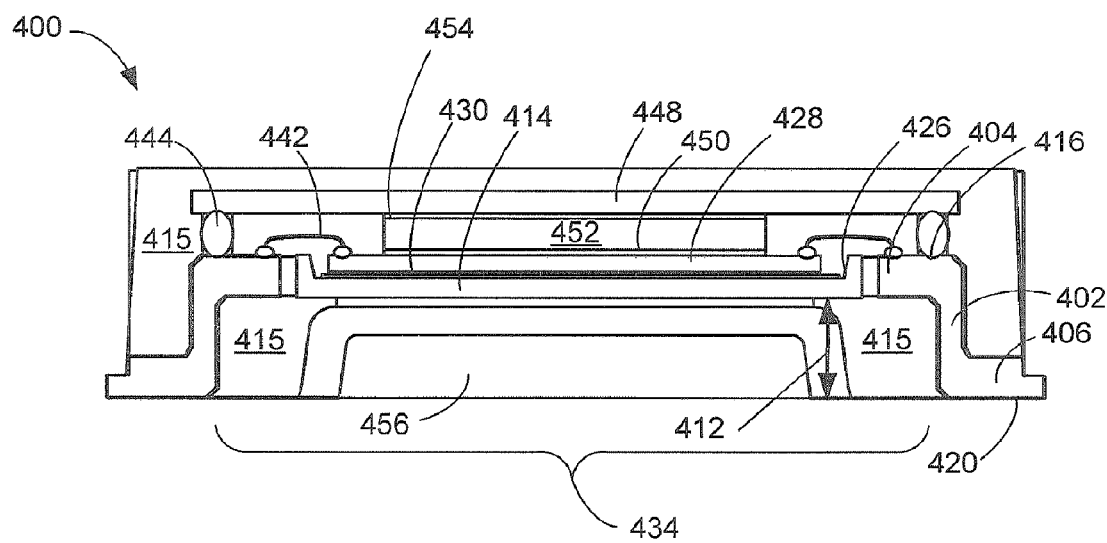
FIG. 4 is a cross-sectional view of a non-leaded integrated circuit package system in yet another alternative embodiment of the present invention.

Referring now to FIG. 4, therein is shown a cross-sectional view of a non-leaded integrated circuit package system 400 in yet another alternative embodiment of the present invention. Similar to the non-leaded integrated circuit package system 300 of FIG. 3, the non-leaded integrated circuit package system 400 includes differential height lead structures 402 with inner leads 404 formed to a paddle height 412 that is the same height as a elevated paddle 414. A first integrated circuit 428 attaches to a paddle recess 426 on the elevated paddle 414 with a first conductive epoxy layer 430. The first integrated circuit 428 connects to top inner lead pads 416 with first electrical interconnects 442. A second integrated circuit 448, shown as a flip-chip, mounts above the first integrated circuit 428 with a first nonconductive adhesive film 450, a first silicon spacer 452, and a second nonconductive adhesive film 454 stacked from the first integrated circuit 428 to the second integrated circuit 448.

The volume below the elevated paddle 414 and surrounded by the differential height lead structures 402 forms a bottom recess 434. The bottom recess 434 is not filled with a molding compound 415. A first conductive epoxy tape 430 attaches a drop-in heat slug 456 to a bottom paddle surface 424 of the elevated paddle 414.

The molding compound 415 encapsulates the first integrated circuit 428, the second integrated circuit 448, the drop-in heat slug 456, the elevated paddle 414, the differential height lead structures 402, first electrical interconnects 442, and second electrical interconnects 444 with bottom outer lead surfaces 420 and the bottom of the drop-in heat slug 456 exposed.

The drop-in heat slug 456 may be any number of constructions, such as silicate copper vanadium material to lower the coefficient of thermal expansion (CTE) mismatch generated during package temperature cycling test. To further reduce the temperature mismatch level, a semi-hemisphere cavity is made out of the heat slug. This further enhances the heat dissipation capability due to shorter heat transfer path and larger heat spreading surface.

Figure 5:
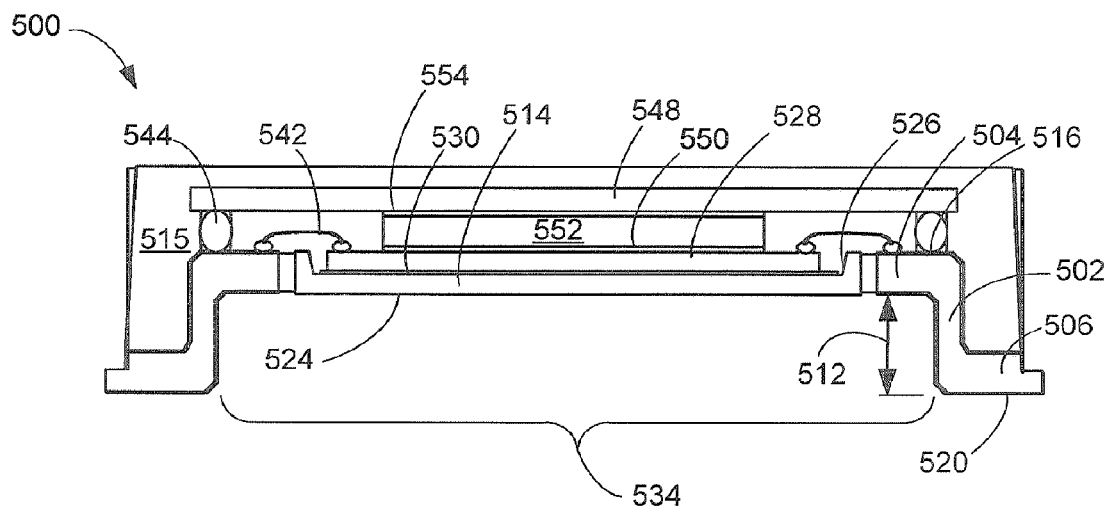
FIG. 5 is a cross-sectional view of a non-leaded integrated circuit package system in yet another alternative embodiment of the present invention.

Referring now to FIG. 5, therein is shown a cross-sectional view of a non-leaded integrated circuit package system 500 in yet another alternative embodiment of the present invention. Similar to the non-leaded integrated circuit package system 400 of FIG. 4, the non-leaded integrated circuit package system 500 includes differential height lead structures 502 with inner leads 504 formed to a paddle height 512 that is the same height as an elevated paddle 514, and outer leads 506. A first integrated circuit 528 attaches to a paddle recess 526 on the elevated paddle 514 with a first conductive epoxy layer 530. The first integrated circuit 528 connects to top inner lead pads 516 with first electrical interconnects 542. A second integrated circuit 548, shown as a flip-chip, mounts above the first integrated circuit 528 with a first nonconductive adhesive film 550, a first silicon spacer 552, and a second nonconductive adhesive film 554 stacked from the first integrated circuit 528 to the second integrated circuit 548.

The volume below the elevated paddle 514 and surrounded by the differential height lead structures 502 forms a bottom recess 534. The bottom recess 534 is not encapsulated.

The bottom recess 534 is not encapsulated by using a bottom mold chase with an array of protruded islands to fill up the original mold compound space. The bottom recess 534 enables package with package integration to form a system in package (SIP) solution. A small package with appropriate I/O count can be mounted below the elevated paddle 514, or mounted directly onto the printed circuit board (not shown) with its I/O traces extended to attach to the non-leaded integrated circuit package system 500.

A molding compound 515 encapsulates the first integrated circuit 528, the second integrated circuit 548, the elevated paddle 514, the differential height lead structures 502, first electrical interconnects 542, and second electrical interconnects 544 with the bottom outer lead surfaces 520 exposed. The bottom recess 534 is not encapsulated also exposing a bottom paddle surface 524 and the inner surface of the differential height lead structures 502 facing the bottom recess 534.

Figure 6:
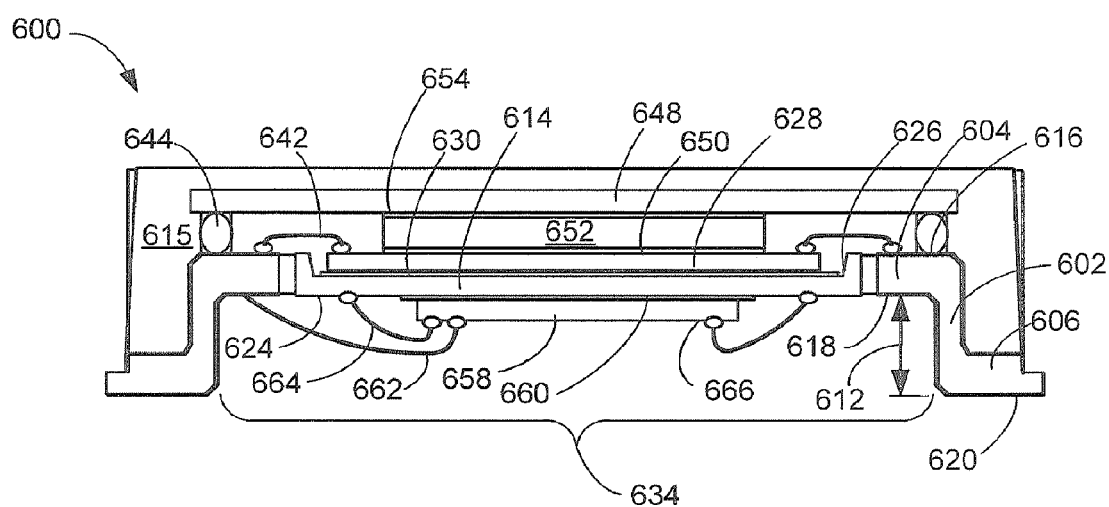
FIG. 6 is a cross-sectional view of a non-leaded integrated circuit package system in a first encapsulation phase, in yet another alternative embodiment of the present invention.

Referring now to FIG. 6, therein is shown a cross-sectional view of a non-leaded integrated circuit package system 600 in a first encapsulation phase, in yet another alternative embodiment of the present invention. The non-leaded integrated circuit package system 600 includes structures similar to the non-leaded integrated circuit package system 500 of FIG. 5 having differential height lead structures 602, including inner leads 604 and outer leads 606. The non-leaded integrated circuit package system 600 also has a first integrated circuit 628 on an elevated paddle 614 and a second integrated circuit 648 above the first integrated circuit 628 separated by a first silicon spacer 652. First electrical interconnects 642 and second electrical interconnects 644 connect the first integrated circuit 628 and the second integrated circuit 648, respectively, to a top inner lead pad 616. A third integrated circuit 658 mounts on a bottom paddle surface 624 with a second conductive epoxy layer 660. Third electrical interconnects 662 and fourth electrical interconnects 664 connect third bonding pads 666 of the third integrated circuit 658 to bottom inner lead pads 618 and the third bonding pads 666 to the bottom paddle surface 624 of paddle recess pads 632, respectively. For illustrative purposes, the third electrical interconnects 662 and the fourth electrical interconnects 664 are shown as bond wires down bonded, although it is understood that the third electrical interconnects 662 and the fourth electrical interconnects 664 may be other electrical structures, such as solder bumps, solder balls, stud bumps, planar interconnects, or conductive posts.

One-sided encapsulation shown in FIG. 5 provided a bottom recess 634 that is not encapsulated by a molding compound 615 and enables integration of other integrated circuits at the bottom paddle surface 624. Plasma gas cleans the bottom paddle surface 624 of the elevated paddle 614 to achieve better bonding condition. The third integrated circuit 658 may share I/O with other integrated circuits (not shown).

Figure 7:
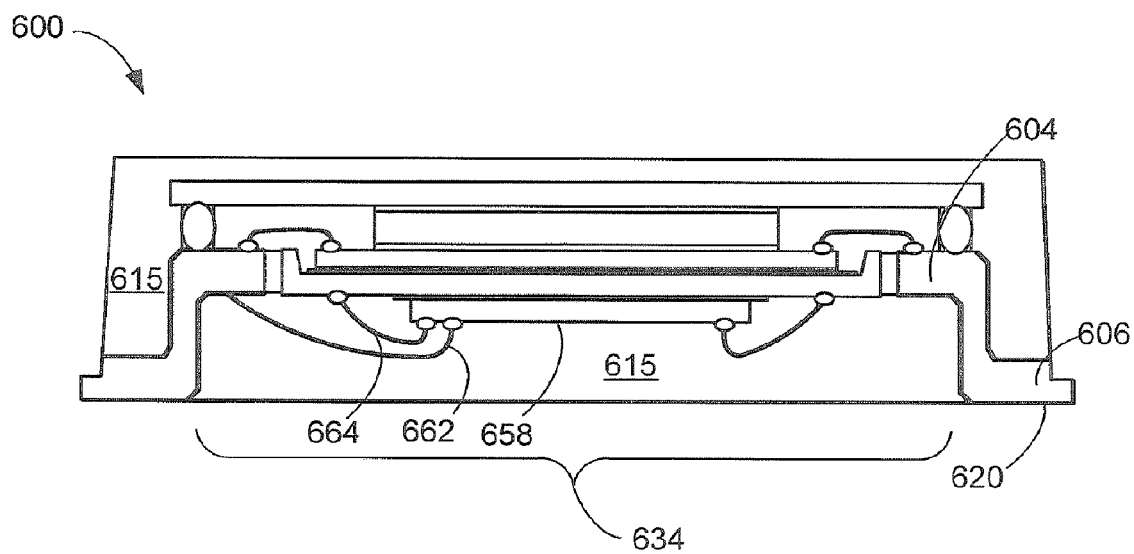
FIG. 7 is a cross-sectional view of the non-leaded integrated circuit package system in a second encapsulation phase, in yet another alternative embodiment of the present invention.

Referring now to FIG. 7, therein is shown a cross-sectional view of the non-leaded integrated circuit package system 600 in a second encapsulation phase, in yet another alternative embodiment of the present invention. After mounting and connecting the third integrated circuit 658, the molding compound 615 encapsulates the non-leaded integrated circuit package system 600 including the bottom recess 634 with the third integrated circuit 658, the third electrical interconnects 662, and the fourth electrical interconnects 664. The second encapsulation phase still leaves bottom outer lead surfaces 620 exposed for additional electrical connections. A chemical mechanical planarization (CMP) may be applied exposing the bottom outer lead surfaces 620.

Figure 8:
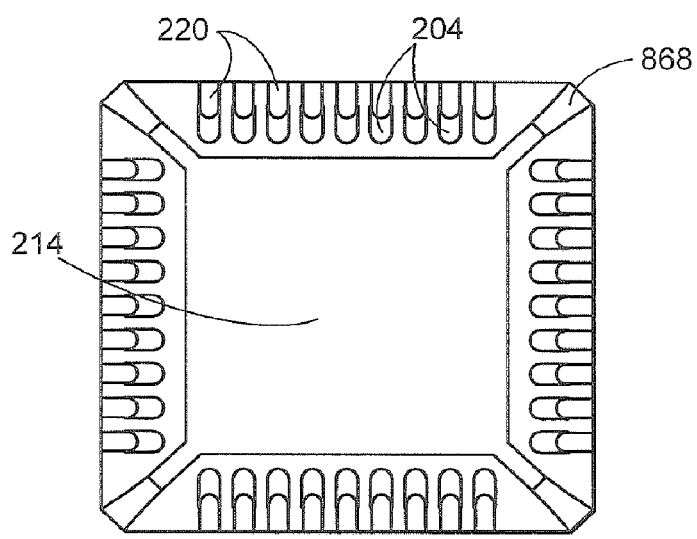
FIG. 8 is a bottom view of the non-leaded integrated circuit package system of FIG. 2.

Referring now to FIG. 8, therein is shown a bottom view of the non-leaded integrated circuit package system 200 of FIG. 2. This bottom view also applies to the non-leaded integrated circuit package system 300 of FIG. 3 and the non-leaded integrated circuit package system 600 of FIG. 6. The bottom view shows the bottom outer lead surfaces 220 with dotted outlines for the inner leads 204. Four tie bars 868 are shown at the corners. An outline of the elevated paddle 214 is also shown at the center of the bottom view.

Figure 9:
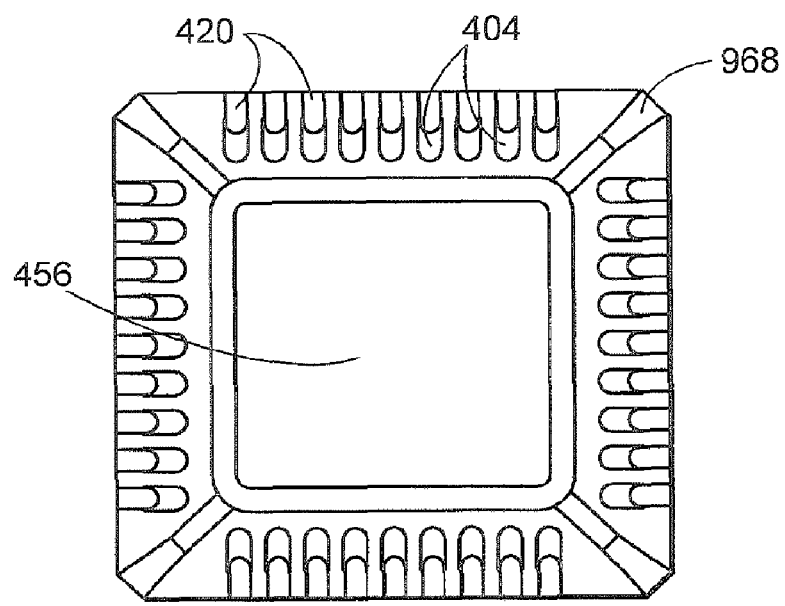
FIG. 9 is a bottom view of the non-leaded integrated circuit package system of FIG. 4.

Referring now to FIG. 9, therein is shown a bottom view of the non-leaded integrated circuit package system 400 of FIG. 4. The bottom view shows the bottom outer lead surfaces 420 with dotted outlines of the inner leads 404. Four tie bars 968 are shown at the corners. The drop-in heat slug 456 is at the center of the bottom view.

Figure 10:
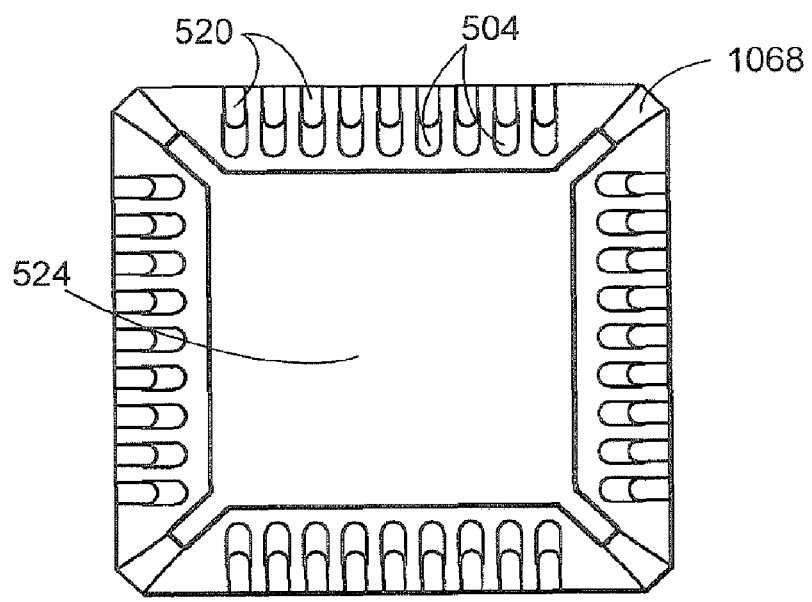
FIG. 10 is a bottom view of the non-leaded integrated circuit package system of FIG. 5.

Referring now to FIG. 10, therein is shown a bottom view of the non-leaded integrated circuit package system 500 of FIG. 5. The bottom view shows the bottom outer lead surfaces 520 with dotted outlines of the inner leads 504. Four tie bars 1068 are shown at the corners. The bottom paddle surface 524 is at the center of the bottom view.

Figure 11:
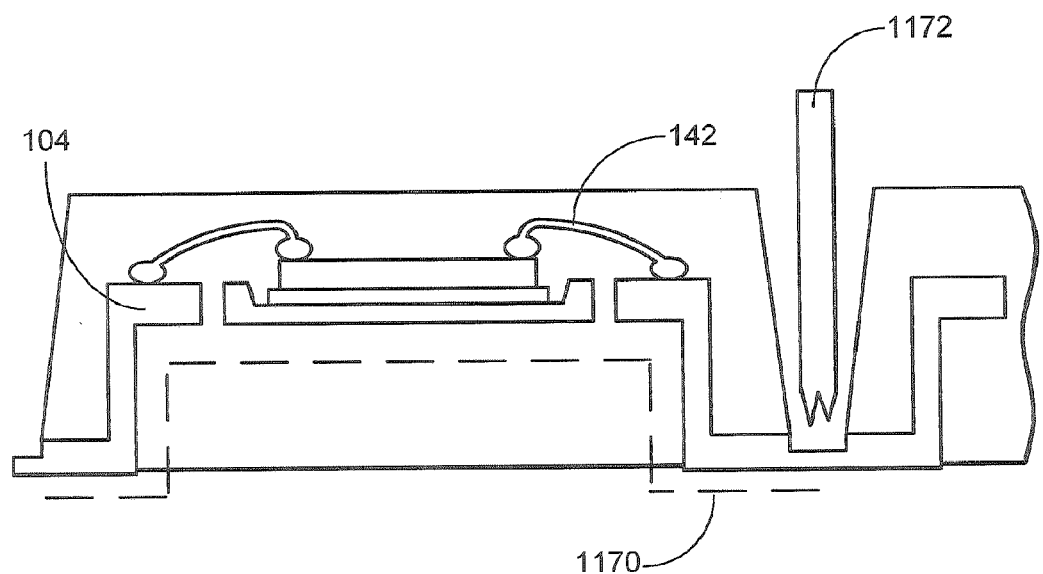
FIG. 11 is a cross-sectional view of the non-leaded integrated circuit package system of FIG. 1 in a singulation phase.

Referring now to FIG. 11, therein is shown a cross-sectional view of the non-leaded integrated circuit package system 100 of FIG. 1 in a singulation phase. During this phase, a partial view of the non-leaded integrated circuit package system 100 in a matrix prior to singulation is shown. A punch tool 1172 singulates the instances of the non-leaded integrated circuit package system 100 with no coverlay tape. An outline is shown for a heater block 1170 location used during wire bond process prior to encapsulation. The punch tool 1172 vertical exertion force cuts the outer leads 106, half-etched, without deflecting the inner leads 104 and the first electrical interconnects 142 resulting in improved manufacturing yields, lowers cost, and enable extensions to a mature packaging technology.

Figure 12:
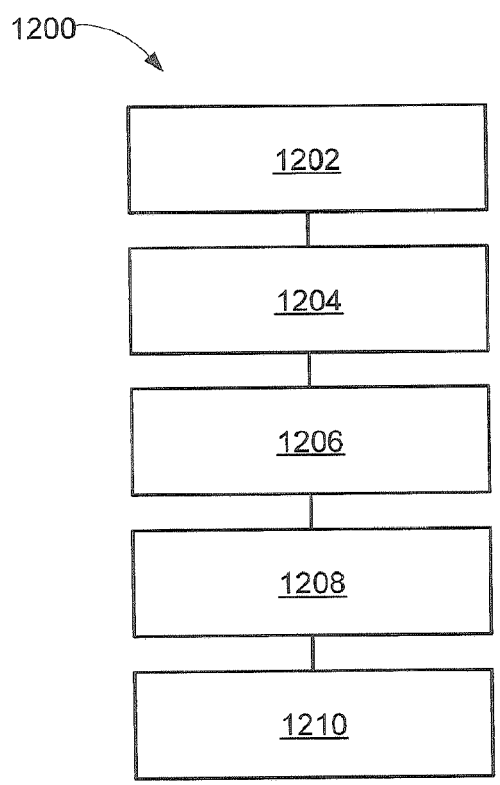
FIG. 12 is a flow chart of a non-leaded integrated circuit package system for manufacturing a non-leaded integrated circuit package system in accordance with an embodiment of the present invention.

Referring now to FIG. 12, therein is shown a flow chart of a non-leaded integrated circuit package system 1200 for manufacturing the non-leaded integrated circuit package system 100 in accordance with an embodiment of the present invention. The non-leaded integrated circuits package system 1200 includes etching differential height lead structures having inner leads at a paddle height in a block 1202; providing mold locks at the bending points of the differential height lead structures in a block 1204; etching an elevated paddle at a same height as the inner leads in a block 1206; mounting a first integrated circuit on the elevated paddle in a block 1208; and electrically connecting first electrical interconnects between the first integrated circuit and the inner leads in a block 1210.

It has been discovered that the present invention thus has numerous aspects.

It has been discovered that a differential height leads, also referred to as an inverted pad-up design, with an elevated paddle, exposed or non-exposed, or heat sink leveled to the middle of the package thickness resolves issues that inhibited continued development and use of improved manufacturing processes of non-leaded integrated circuit packages. The present invention alleviates problems to leverage punch singulation and metal etching enabling integrated circuit stacking with higher yields, lower cost, and increased market penetration.

An aspect is that the present invention provides improved performance during manufacturing test and subsequently improved yield. The differential height lead structures provide better moisture resistance test (MRT) performance. Differential height lead structures by construction have double mold gripping effects or mold locking features at the bending points to the inner and outer leads for minimizing top of lead delamination (TOLD) after moisture sensitivity level (MSL) stress test.

Another aspect is that the present invention provides additional manufacturing yields from utilizing chemical etching process. Chemical etching processes use photoresist mask technology enabling more variations of lead frame designs while providing tighter dimension control. Differential height lead structures are formed using chemical half-etch resulting in shorter vertical leads compared to other processes. The chemical half-etch process minimizes stress if compared to stamping or coining process. Stamping or coining processes usually require a planar shearing mechanism that deforms raw materials, such as material grain size deformation from lattice distortion. Chemical etching prevents certain complicated forms and shapes required by coining shearing tool and tool clearance space.

Yet another aspect is that the present invention results in improved performance. The elevated heat sink/die paddle is at the same height with the elevated inner portion of the differential height lead structures. This feature provides shorter wire loop from integrated circuit bonding pads to the inner leads, thus resulting in fast signal transmission from the semiconductor device to its external interconnect leads. The bending points of the differential height lead structures may be curved as opposed to having sharp edges to minimize signal reflection. The shorter wire loop provides a shorter path with larger skin loss from the bond wires before reaching the differential height lead structures with less skin loss.

Yet another aspect is that the present invention provides or package to package stacking option. The bottom outer lead surfaces can be used as a bonding platform for wire placement. A top overhang stack can also be assembled to reduce the total wire length based on wire routing configuration and requirement. For integrated circuit stacking in a single package, the stacking integrated circuit on top of another integrated circuit has longer wire length to avoid wire entanglement. Bottom portion of the inner leads that are not pad-up can be used as second tier bonding platform for stacking integrated circuit from the bottom. Bottom stacking provides dedicated individual lead for interconnect wire placement also avoiding wires entanglement.

Yet another aspect is that the present invention results in overall package cost savings. Since the present invention uses the punch singulation method, coverlay tape material is not used on the lead frame bottom surface as unit-to-unit encapsulation is preferred rather than the mapping encapsulation for saw type QFN. Cost saving is achieved by eliminating the coverlay tape material cost during manufacturing. Also, shorter wire loops use less Au/Cu wire material. The shorter distance also saves material costs with other electrical interconnect structures are used, such as conductive posts or planar interconnects.

Yet another aspect is that the present invention further improves yield from the wire bond phase. Without coverlay, the differential height lead structures and the elevated paddle/heat sink will utilize protruded islands on the heater block to support both hanging structures during wire bond process. This provides a firm and stable platform resulting in minimizing vibration disturbances during wire bond process. The heater block used in thermosonic ball bond will have a dedicated island built for each unit in a matrix arrangement, corresponding to the lead frame matrix outline per panel opening size. The protruded island will fully support the elevated paddle and the differential height lead structures.

Yet another aspect is that the present invention improves thermal dissipation. Additional heat sink may be attached or integrated to the bottom surface of the elevated paddle or center cavity heat sink providing improved top and bottom heat dissipation from the shorter path for heat transfer from the integrated circuits to package ambient.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the differential height lead structures and elevated paddle for non-leaded integrated circuit package of the present invention furnish important and heretofore unknown and unavailable solutions, capabilities, and functional aspects for increasing chip density in systems while making the multiple device packages easier to manufacture reliably. The resulting processes and configurations are straightforward, cost-effective, uncomplicated, highly versatile and effective, can be implemented by adapting known technologies, and are thus readily suited for efficiently and economically manufacturing large die integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method of manufacture of a non-leaded integrated circuit package system comprising:
    etching differential height lead structures to form inner leads and outer leads, the outer leads comprising bottom outer lead surfaces and a reduced height extension, the reduced height extension having a height less than that of the outer lead, and the differential height lead structures having different heights with transition points between the inner leads and the outer leads, having the inner leads at a paddle height;
    providing mold locks at the transition points of the differential height lead structures;
    etching an elevated paddle at a same height as the inner leads;
    mounting a first integrated circuit on the elevated paddle;
    electrically connecting first electrical interconnects between the first integrated circuit and the inner leads; and
    applying a molding compound with the mold locks within the molding compound for exposing the bottom outer surfaces of the lead structures and the reduced height extension protruding from a side of the molding compound and extending along the bottom outer lead surfaces.

2. The method as claimed in claim 1 wherein mounting the first integrated circuit on the elevated paddle comprises providing a heat sink for the first integrated circuit.

3. The method as claimed in claim 1 further comprising encapsulating a molding compound around the first integrated circuit, the elevated paddle, the differential height lead structures, and the first electrical interconnects.

4. The method as claimed in claim 1 wherein etching the differential height lead structures having the inner leads at the paddle height comprises etching outer leads of the differential height lead structures for a half-etch for punch singulation method.

5. The method as claimed in claim 1 wherein etching the differential height lead structures having the inner leads at the paddle height comprises providing a second tier interconnect for bonding.

6. A method of manufacture of a non-leaded integrated circuit package system comprising:
    etching differential height lead structures to form inner leads and outer leads at different heights, the outer leads comprising bottom outer lead surfaces, and a reduced height extension, the reduced height extension having a height less than that of the outer lead, and the inner and outer leads at different heights with transition points between the inner leads and the outer leads, having the inner leads at a paddle height toward the interior and the outer leads towards the bottom periphery;
    providing an inner mold lock at the transition points of the differential height lead structures transition to the inner leads;
    providing an outer mold lock at the transition points of the differential height lead structures transition to the outer leads;
    etching an elevated paddle at a same height as the inner leads;
    mounting a first integrated circuit on a paddle recess of the elevated paddle;
    electrically connecting first electrical interconnects between the first integrated circuit and the inner leads using a heater block below the inner leads and the elevated paddle to provide mechanical stability; and
    forming a molding compound with the inner mold lock and the outer mold lock within the molding compound for exposing the bottom outer lead surfaces of the lead structures and the reduced height extension protruding from a side of the molding compound and extending along the bottom outer lead surface.

7. The method as claimed in claim 6 further comprising:
    mounting a second integrated circuit above the first integrated circuit;
    electrically connecting second electrical interconnects between the second integrated circuit and the inner leads; and
    encapsulating a molding compound around the first integrated circuit, the second integrated circuit, the elevated paddle, the differential height lead structures, the first electrical interconnects, and the second electrical interconnects.

8. The method as claimed in claim 6 further comprising:
    mounting a second integrated circuit above the first integrated circuit;
    electrically connecting second electrical interconnects between the second integrated circuit and the inner leads;
    attaching a drop-in heat slug to the bottom paddle surface of the elevated paddle; and
    encapsulating a molding compound around the first integrated circuit, the second integrated circuit, the elevated paddle, the differential height lead structures, the first electrical interconnects, the second electrical interconnects and the drop-in heat slug.

9. The method as claimed in claim 6 further comprising:
    mounting a second integrated circuit above the first integrated circuit;

electrically connecting second electrical interconnects between the second integrated circuit and the inner leads;

providing a bottom recess below the elevated paddle and surrounded by the differential height lead structures; and encapsulating a molding compound around the first integrated circuit, the second integrated circuit, the elevated paddle, the differential height lead structures, the first electrical interconnects, and the second electrical interconnects with the bottom recess not encapsulated.

10. The method as claimed in claim 6 further comprising:

mounting a second integrated circuit above the first integrated circuit;

electrically connecting second electrical interconnects the second integrated circuit to the inner leads;

attaching a third integrated circuit to a bottom paddle surface of the elevated paddle;

electrically connecting third electrical interconnects the third integrated circuit to bottom inner lead pads of the inner leads and the bottom paddle surface; and encapsulating a molding compound around the first integrated circuit, the second integrated circuit, the third integrated circuit, the elevated paddle, the differential height lead structures, the first electrical interconnects, the second electrical interconnects, and the third electrical interconnects.

11. A non-leaded integrated circuit package system comprising:

differential height lead structures having inner leads at a paddle height and outer leads, with bottom outer lead surfaces and a reduced height extension, the reduced height extension having a height less than that of the outer lead, and the differential height lead structures having different heights;

mold locks at the bending points of the differential height lead structures;

an elevated paddle at a same height as the inner leads;

a first integrated circuit on the elevated paddle;

first electrical interconnects between the first integrated circuit and the inner leads; and a molding compound with mold locks within the molding compound for exposing the bottom outer lead surfaces of the lead structures and the reduced height extension protruding from a side of the molding compound and extending along the bottom outer lead surfaces.

12. The system as claimed in claim 11 wherein the first integrated circuit on the elevated paddle comprises a heat sink for the first integrated circuit.

13. The system as claimed in claim 11 further comprising a molding compound around the first integrated circuit, the elevated paddle, the differential height lead structures, and the first electrical interconnects.

14. The system as claimed in claim 11 wherein the differential height lead structures having inner leads at the paddle height comprises outer leads of the differential height lead structures for a half-etch for punch singulation method.

15. The system as claimed in claim 11 wherein the differential height lead structures having the inner leads at the paddle height comprises a second tier interconnect for bonding.

16. A non-leaded integrated circuit package system comprising:

differential height lead structures having inner leads towards the interior and outer leads, with bottom outer lead surfaces and a reduced height extension, the reduced height extension having a height less than that of the outer lead, and the differential height lead structures having different heights;

an inner mold lock at the bending point of the differential height lead structures transition to the inner leads;

an outer mold lock at the bending point of the differential height lead structures transition to the outer leads;

an elevated paddle at a same height as the inner leads;

a first integrated circuit on a paddle recess of the elevated paddle;

first electrical interconnects between the first integrated circuit and the inner leads; and a molding compound with the inner mold lock and the outer mold lock within the molding compound for exposing the bottom outer lead surfaces of the lead structures and the reduced height extension protruding from a side of the molding compound and extending along the bottom outer lead surfaces.

17. The system as claimed in claim 16 further comprising a second integrated circuit above the first integrated circuit comprises:

second electrical interconnects between the second integrated circuit and the inner leads; and a molding compound around the first integrated circuit, the second integrated circuit, the elevated paddle, the differential height lead structures, the first electrical interconnects, and the second electrical interconnects.

18. The system as claimed in claim 16 further comprising a second integrated circuit above the first integrated circuit comprises:

second electrical interconnects between the second integrated circuit and the inner leads;

a drop-in heat slug to the bottom paddle surface of the elevated paddle; and a molding compound around the first integrated circuit, the second integrated circuit, the elevated paddle, the differential height lead structures, the first electrical interconnects, the second electrical interconnects and the drop-in heat slug.

19. The system as claimed in claim 16 further comprising a second integrated circuit above the first integrated circuit comprises:

second electrical interconnects between the second integrated circuit and the inner leads;

a bottom recess below the elevated paddle and surrounded by the differential height lead structures; and a molding compound around the first integrated circuit, the second integrated circuit, the elevated paddle, the differential height lead structures, the first electrical interconnects, and the second electrical interconnects with the bottom recess not encapsulated.

20. The system as claimed in claim 16 further comprising a second integrated circuit above the first integrated circuit comprises:

second electrical interconnects the second integrated circuit to the inner leads;

a third integrated circuit to a bottom paddle surface of the elevated paddle;

third electrical interconnects between the third integrated circuit to bottom inner lead pads of the inner leads and the bottom paddle surface; and a molding compound around the first integrated circuit, the second integrated circuit, the third integrated circuit, the elevated paddle, the differential height lead structures, the first electrical interconnects, the second electrical interconnects, and the third electrical interconnects.

* * * * *

UNITED STATES PATENT AND TRADEMARK OFFICE
CERTIFICATE OF CORRECTION

| | | |
|---|---|---|
| PATENT NO. | : 8,093,694 B2 | Page 1 of 1 |
| APPLICATION NO. | : 11/164088 | |
| DATED | : January 10, 2012 | |
| INVENTOR(S) | : Ong | |

It is certified that error appears in the above-identified patent and that said Letters Patent is hereby corrected as shown below:

Column 5:
line 9, delete "less than 75 µm resulting" and insert therefor --75µm resulting--

Column 6:
line 15, delete "4 mil, for" and insert therefor --4mil, for--
line 18, delete "75 µm." and insert therefor --75µm.--

Column 11:
claim 1, lines 54-55, delete "outer surfaces of the lead" and insert therefor --outer lead surfaces of
    the lead--

Column 12:
claim 6, line 17, delete "toward the interior" and insert therefor --towards the interior--
claim 6, line 40, delete "outer lead surface." and insert therefor --outer lead surfaces.--

Column 13:
claim 11, line 41, delete "compound with mold" and insert therefor --compound with the mold--

Signed and Sealed this
Twelfth Day of June, 2012

David J. Kappos
*Director of the United States Patent and Trademark Office*